(12) United States Patent
Wang

(10) Patent No.: US 8,136,963 B2
(45) Date of Patent: Mar. 20, 2012

(54) LIGHT MODULE

(75) Inventor: Jen-Hui Wang, Taipei (TW)

(73) Assignee: Everlight Electronics Co., Ltd., Taipei (TW)

( * ) Notice: Subject to any disclaimer, the term of this patent is extended or adjusted under 35 U.S.C. 154(b) by 430 days.

(21) Appl. No.: 12/491,116

(22) Filed: Jun. 24, 2009

(65) Prior Publication Data

US 2010/0124060 A1    May 20, 2010

(30) Foreign Application Priority Data

Nov. 20, 2008  (TW) ................................ 97144893 A

(51) Int. Cl.
*F21V 7/04* (2006.01)
(52) U.S. Cl. .......... 362/249.08; 362/249.04; 362/249.06
(58) Field of Classification Search .............. 362/249.02–249.08; 29/592.1
See application file for complete search history.

(56) References Cited

U.S. PATENT DOCUMENTS

| | | | |
|---|---|---|---|
| 7,736,016 B2 * | 6/2010 | Suehiro et al. | 362/218 |
| 7,896,514 B2 * | 3/2011 | Gomi | 362/97.3 |
| 2010/0157595 A1 * | 6/2010 | Lin et al. | 362/235 |

FOREIGN PATENT DOCUMENTS

| | | |
|---|---|---|
| CN | 2851836 Y | 12/2006 |
| JP | 55-135475 | 10/1980 |
| JP | 04-032290 | 2/1992 |
| JP | 04-093092 | 3/1992 |
| JP | 07-043554 | 2/1995 |
| JP | 2000-100216 | 4/2000 |
| JP | 2005-191432 | 7/2005 |
| JP | 2007-106214 | 4/2007 |
| TW | M331851 | 5/2008 |
| TW | M353120 | 3/2009 |
| TW | 201025559 A1 | 9/2009 |

* cited by examiner

*Primary Examiner* — Thomas Sember

(57) ABSTRACT

A light module is provided and includes a main body and at least an LED. The main body comprises an outer surface and at least a bending portion protruding therefrom, wherein the LED is disposed on the bending portion. Specifically, the bending portion and the outer surface form an included angle θ therebetween, wherein 0°<θ<180°.

10 Claims, 7 Drawing Sheets

LIGHT MODULE

CROSS REFERENCE TO RELATED APPILCATIONS

This Application claims priority of Taiwan Patent Application No. 097144893, filed on Nov. 20, 2008, the entirety of which is incorporated by reference herein.

TECHNICAL FIELD

The application relates in general to a light module and in particular to a three-dimensional light module.

DESCRIPTION OF THE RELATED ART

Referring to FIG. 1, a conventional three-dimensional light module primarily includes a plastic base 10 and a plurality of longitudinal flexible printed circuits 20 disposed thereon. Several LEDs L are mounted on each of the flexible printed circuits 20. During assembly, the flexible printed circuits 20 are adhered to a wavy surface 11 of the base 10, so as to vary lighting angle of the LEDs L and facilitate a three-dimensional model of the light module.

Due to the fact that the light module needs the large plastic base 10 for supporting the flexible printed circuits 20 and LEDs L. Besides, the flexible printed circuits 20 need to fasten on the plastic base 10 individually to complete the assembly process. Therefore, the cost is high and being unfavorable in mass production.

BRIEF SUMMARY

The present application provides a light module including a main body and at least an LED. The main body comprises an outer surface and at least a bending portion protruding therefrom, wherein the LED is disposed on the bending portion. Specifically, the bending portion and the outer surface form an included angle θ therebetween, wherein 0°<θ<180°.

BRIEF DESCRIPTION OF DRAWINGS

The application can be more fully understood by reading the subsequent detailed description and examples with references made to the accompanying drawings, wherein.

DETAILED DESCRIPTION

Figure 1:
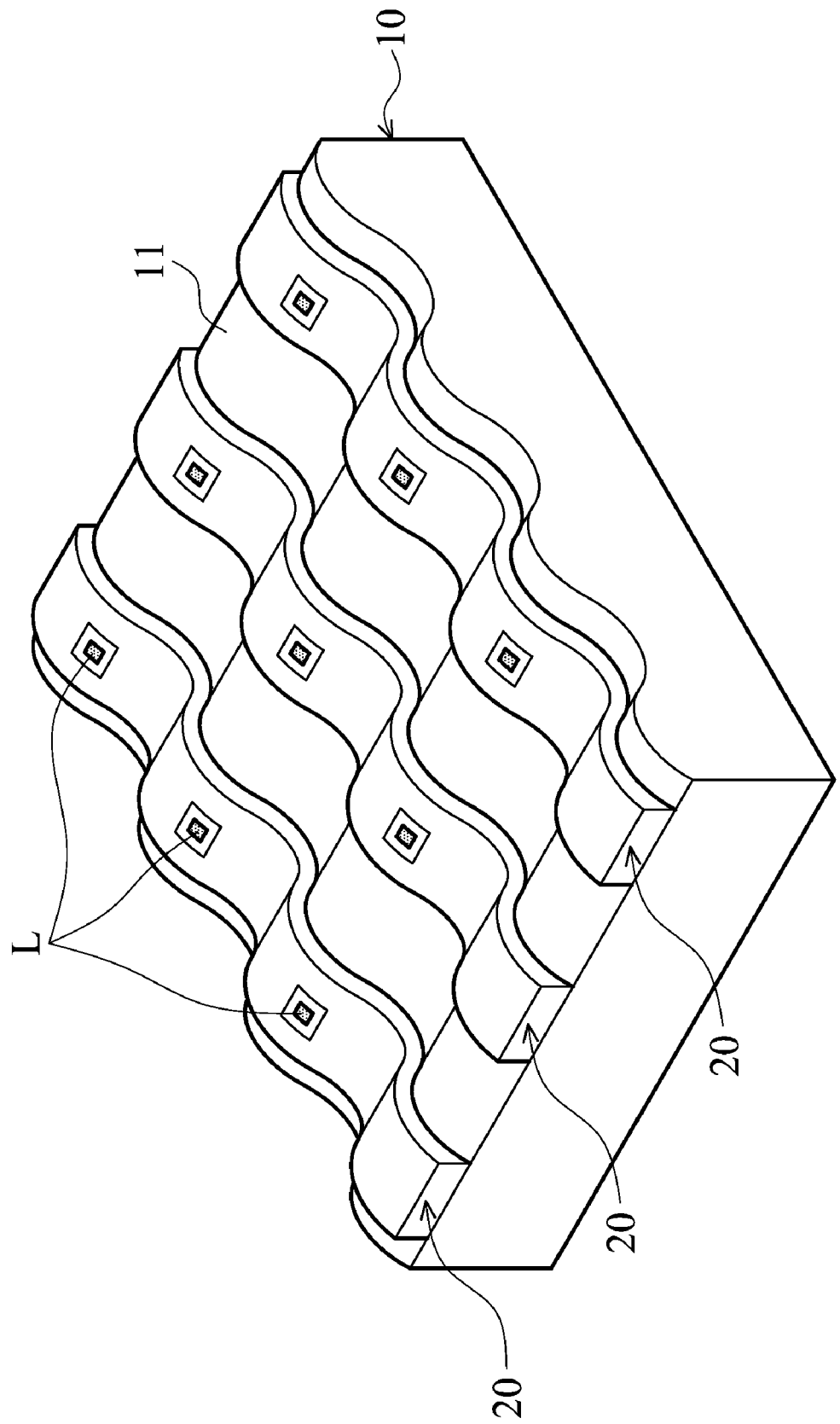
FIG. 1 is a perspective diagram of a conventional light module.
Figure 2:
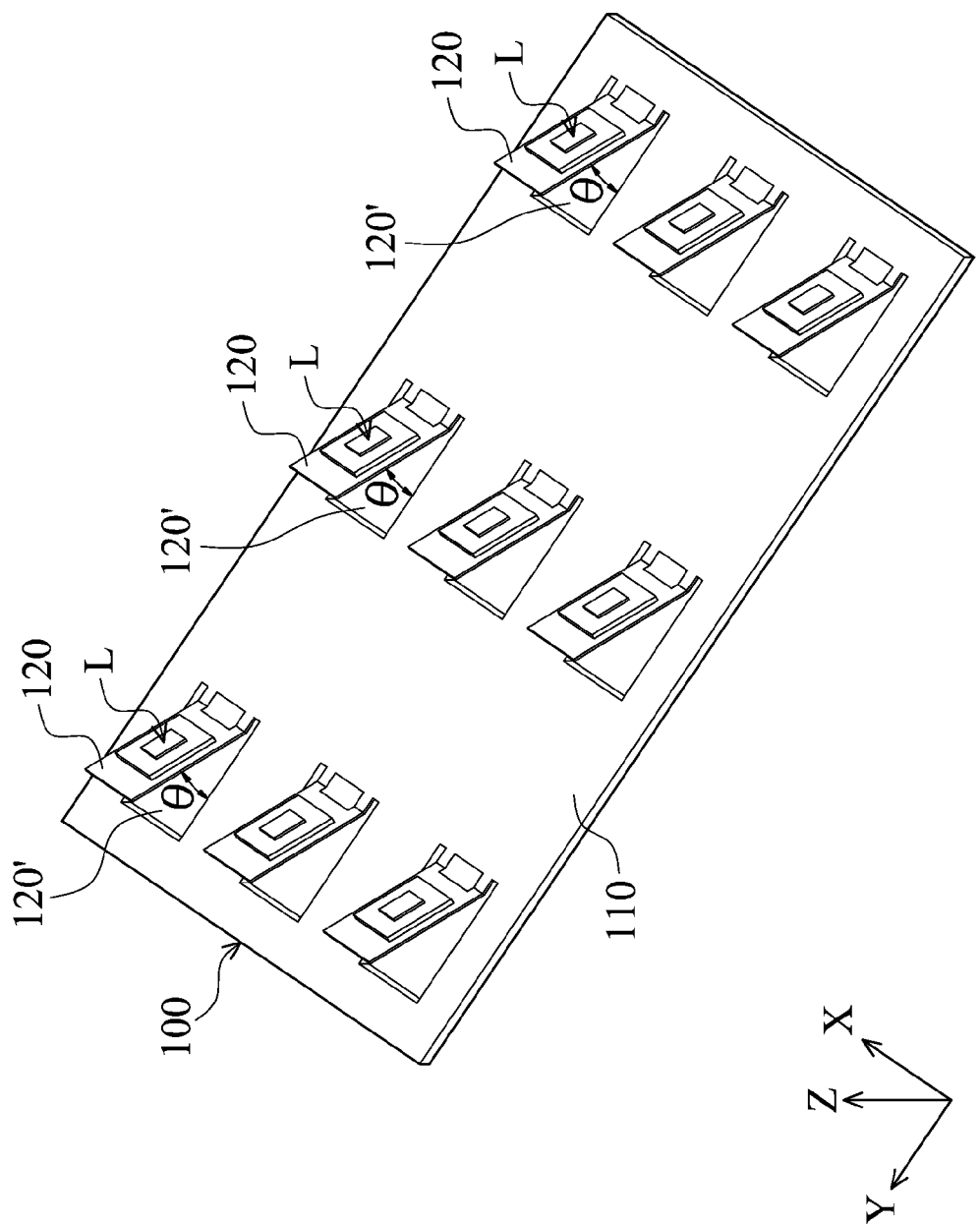
FIG. 2 is perspective diagram of a light module according to an embodiment of the invention.

Referring to FIG. 2, an embodiment of a three-dimensional light module primarily comprises a main body 100 and a plurality of LEDs L. The main body 100 comprises an outer surface 110 parallel to an XY plane, a plurality of openings 120', and a plurality of bending portion 120 corresponding to the openings 120'. The bending portions 120 protrude from the outer surface 110 along a Z direction, and an included angle θ is formed between the bending portions 120 and the outer surface 110, 0°<θ<180°.

Figure 3:
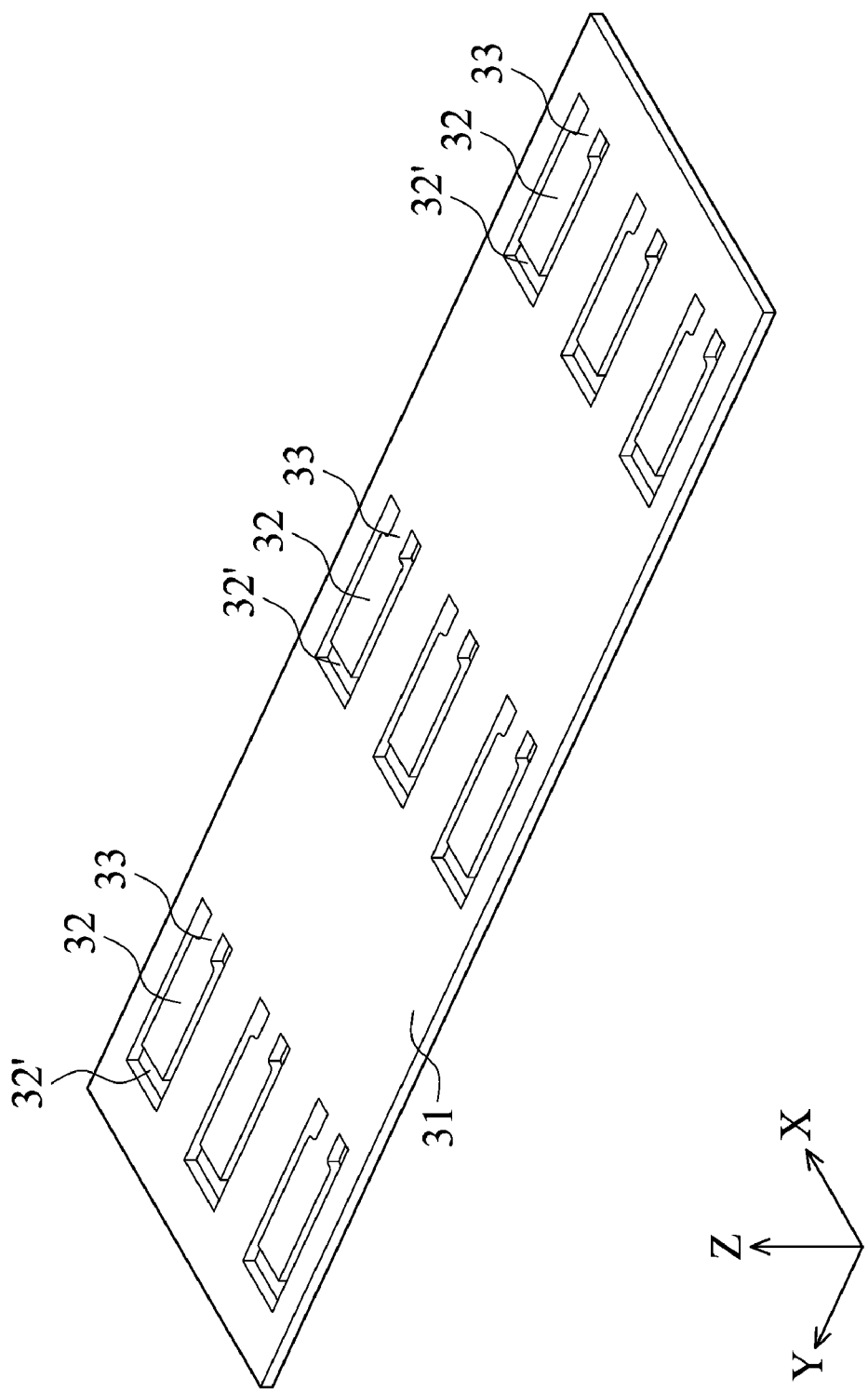
FIG. 3 is a perspective diagram of a substrate according to an embodiment of the invention.
Figure 4:
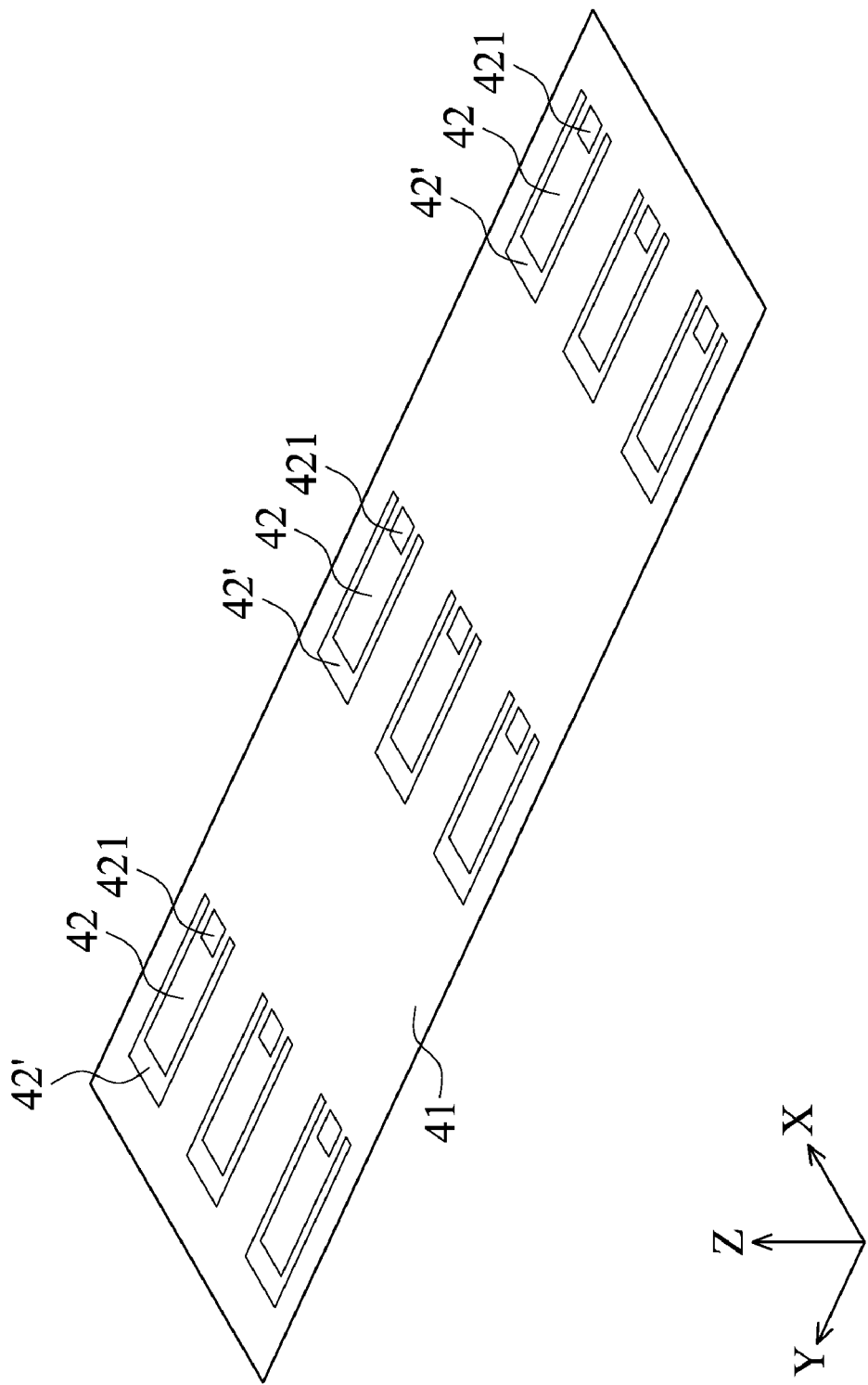
FIG. 4 is a perspective diagram of a flexible printed circuit according to an embodiment of the invention.

As shown in FIG. 2, the LEDs L are respectively disposed on the bending portions 120, so that the included angle θ is formed between the bending portions 120 and the outer surface 110. Therefore, a three-dimensional light module is constructed to be a light source of a display or an illumination device. In this embodiment, the main body 100 comprises a substrate 30 and a flexible printed circuit 40, as shown in FIGS. 3 and 4. Detailed structure and assembly sequences of the three-dimensional light module are disclosed as follows.

The substrate 30 of FIG. 3 is made of aluminum or other metal material, and it comprises a first surface 31 parallel to an XY plane, a plurality of first bending portions 32, a first slots 32', and connection portions 33. The first slots 32' are substantially U-shaped and formed on the first surface 31 by punching, so as to define the first bending portions 32 and the connection portions 33. As shown in FIG. 3, the connection portion 33 is formed between opposite sides of the first slot 32' as a bridge connecting the bending portions 32 and the first surface 31, wherein width of the connection portion 33 along an X axis is smaller than that of the first bending portion 32.

The flexible printed circuit 40 of FIG. 4 comprises a second surface 41, a plurality of second bending portions 42 and second slots 42'. The second slots 42' are substantially U-shaped and formed on the second surface 41 by punching, so as to define the second bending portions 42 and the connection portions 33. In this embodiment, the second bending portions 42 has a hole 421 located adjacent to the second surface 41 and above the connection portion 33.

Figure 5:
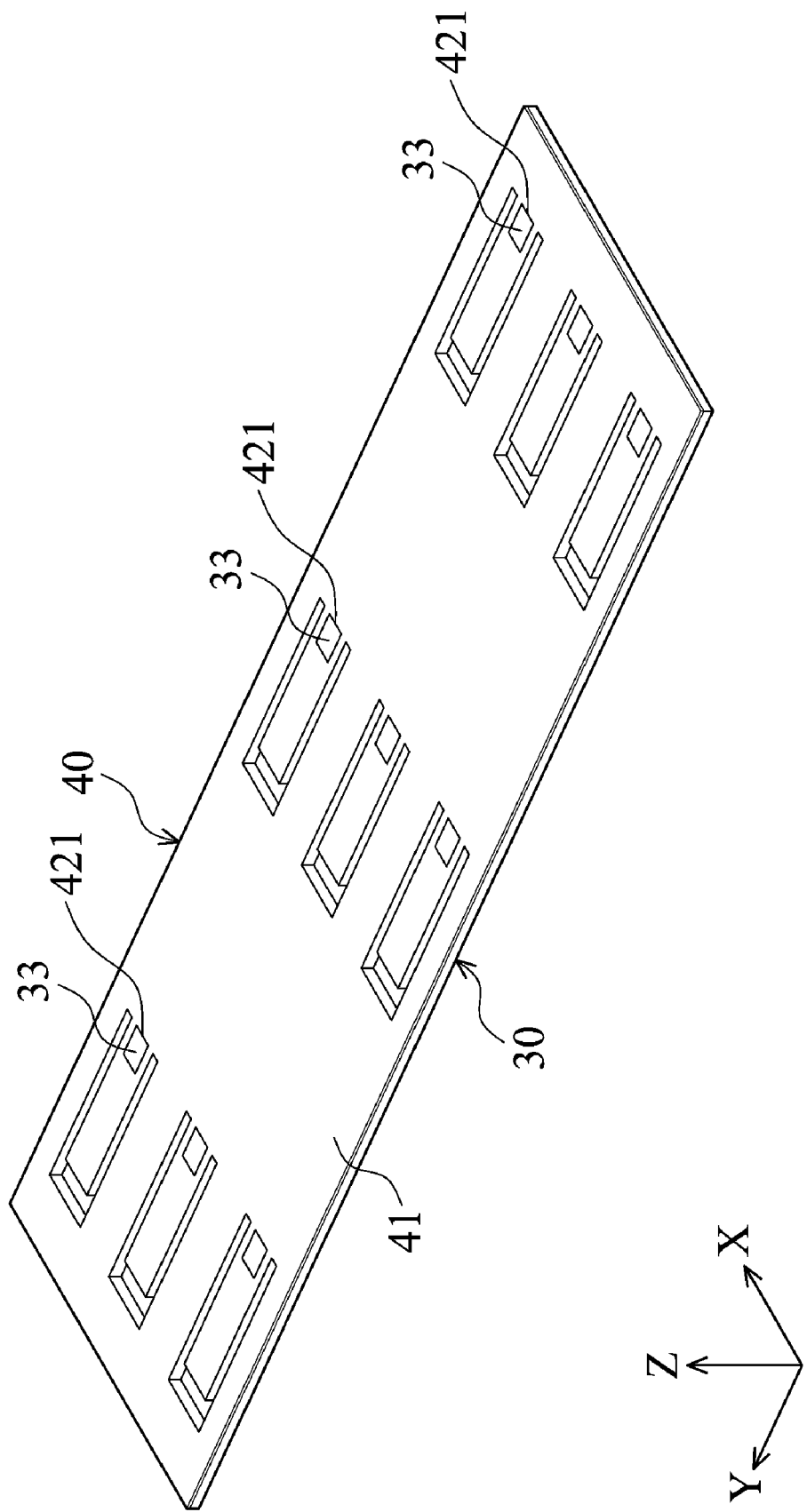
FIG. 5 is a perspective diagram of the flexible printed circuit of FIG. 4 adhered to the substrate of FIG. 3.

Referring to FIG. 5, the flexible printed circuit 40 is adhered to the substrate 30, and the first and second bending portions 32 and 42 overlap. As shown in FIG. 5, the connection portion 33 is exposed to the hole 421 and separated from the flexible printed circuit 40, thus preventing the flexible printed circuit 40 from deform damages caused by bending the connection portion 33.

Figure 6:
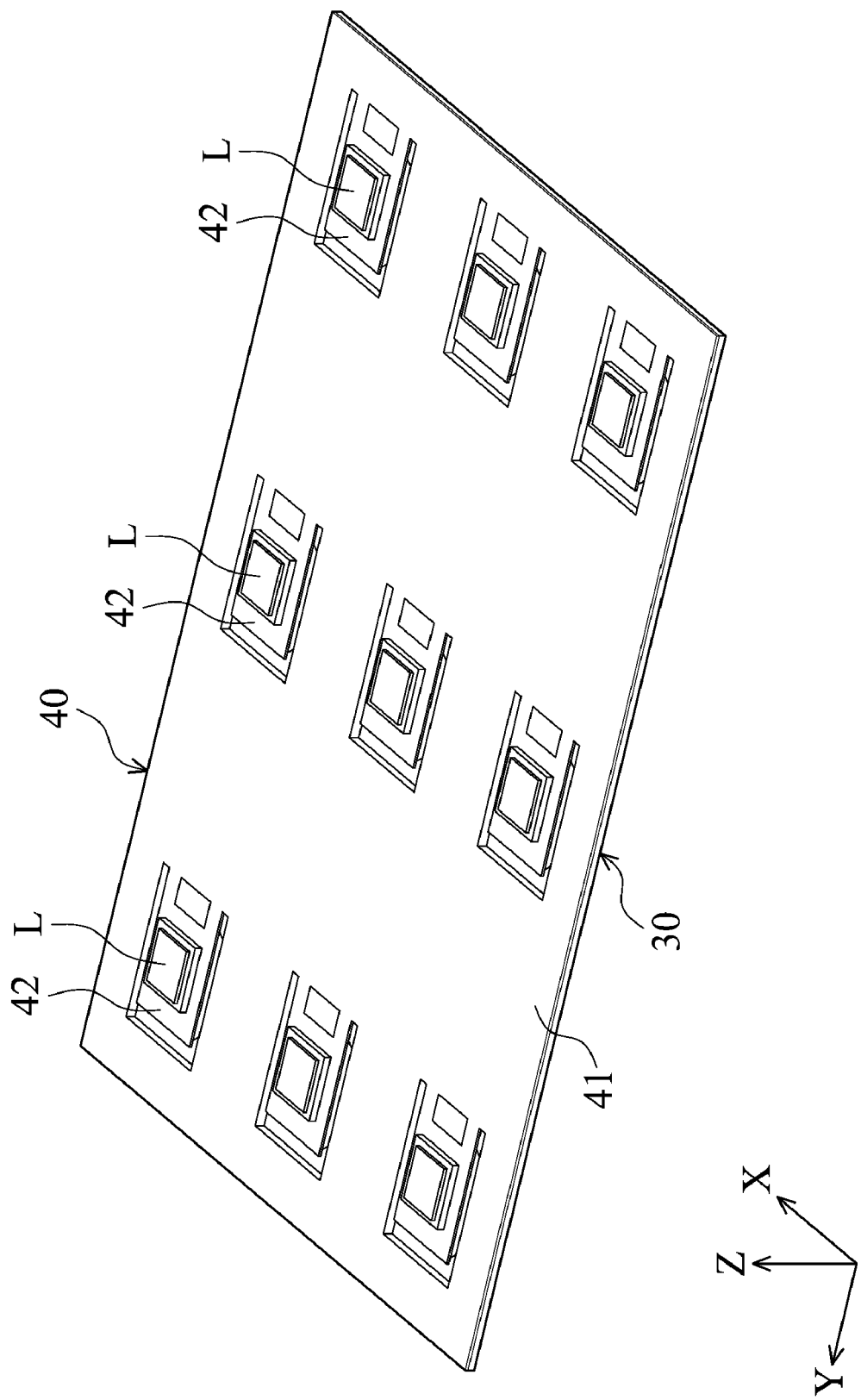
FIG. 6 is a perspective diagram of a plurality of LEDs respectively disposed on the second bending portions.

After fixing the flexible printed circuit 40 to the substrate 30, the LEDs L are respectively mounted on the second bending portions 42, as shown in FIG. 6. Subsequently, the first and second bending portions 32 and 42 are bent toward a Z direction to form the three-dimensional light module of FIG. 2. The bending portion 120 in FIG. 2 is formed by the first and second bending portions 32 and 42, and the outer surface 110 of the main body 100 in FIG. 2 denotes the second surface 41 of the flexible printed circuit 40.

Figure 7:
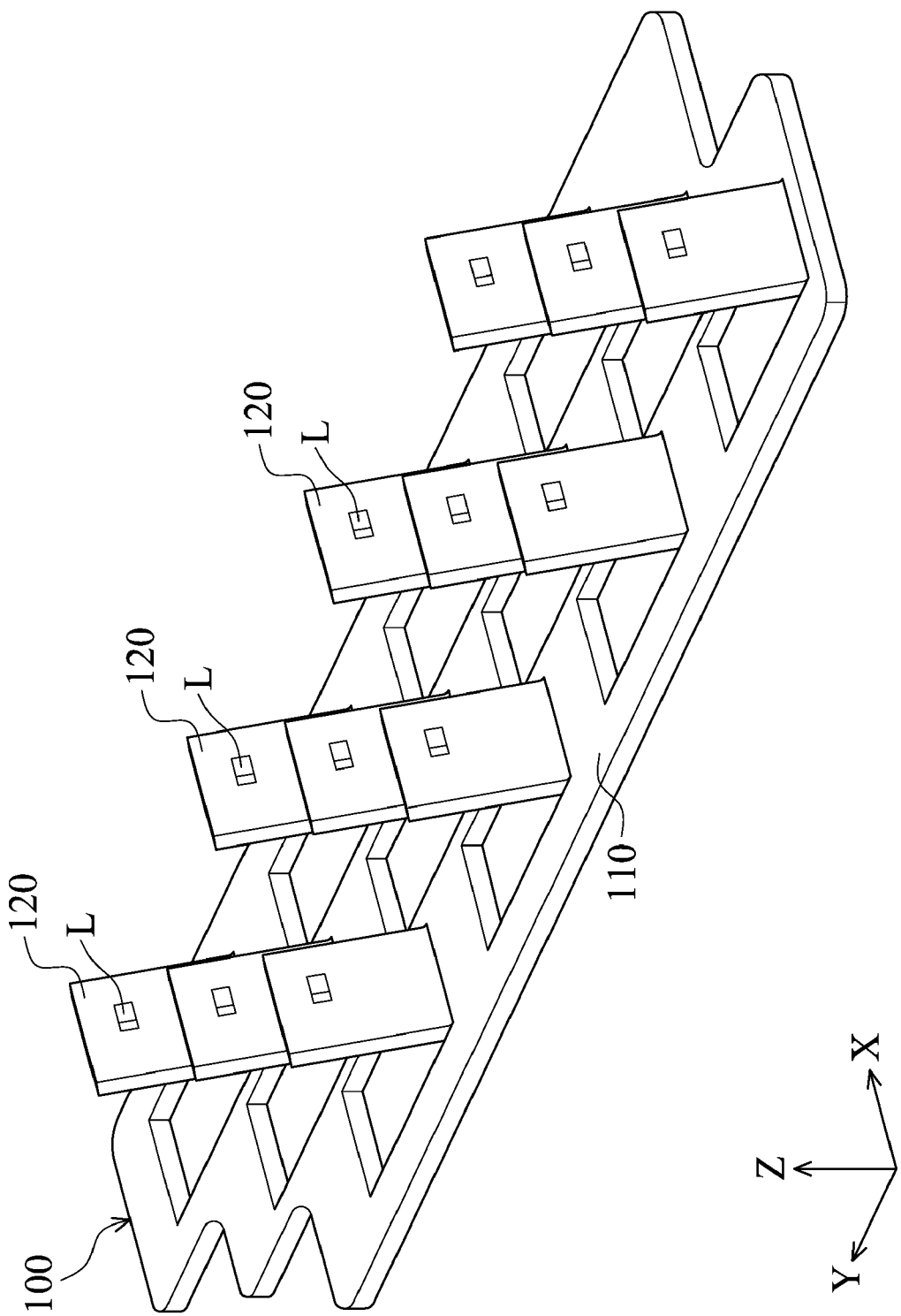
FIG. 7 is a perspective diagram of a light module according to another embodiment of the invention.

In FIG. 2, the bending portions 120 of the main body 100 are arranged in a matrix manner. In some embodiments, the bending portions 120 may also be arranged in a staggered manner, as shown in FIG. 7, to provide different visual effects.

The invention provides a three-dimensional light module comprising a main body forming a plurality of bending portions. Each of the bending portion protrudes from an outer surface of the main body at an included angle θ (0°<θ<180°), so as to vary posture and lighting angle of the LEDs. As the light module does not require a large plastic base, it is suitable for mass production with less production time and costs when compared to conventional light modules.

While the invention has been described by way of example and in terms of embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A light module, comprising:
   a substrate, comprising a first surface, a first bending portion connected to the first surface, and a first slot formed on the first surface to form the first bending portion; and
   a flexible printed circuit connected to the substrate, comprising a second surface, a second bending portion connected to the second surface and adhered to the first bending portion, and a second slot formed on the first surface to form the second bending portion, wherein the first and second bending portions protrude from the second surface and form an included angle θ therebetween, wherein 0°<θ<180°.

2. The light module as claimed in claim 1, wherein the first slot is substantially U-shaped.

3. The light module as claimed in claim 2, wherein the substrate further comprises a connection portion formed between two opposite sides of the first slot to connect the first bending portion and the first surface, wherein width of the connection portion between the two opposite sides of the first slot is smaller than that of the first bending portion between the two opposite sides of the first slot.

4. The light module as claimed in claim 3, wherein the second bending portion has a hole located corresponding to the connection portion.

5. The light module as claimed in claim 4, wherein the connection portion is exposed by the hole.

6. The light module as claimed in claim 1, wherein the second slot is substantially U-shaped.

7. The light module as claimed in claim 1, wherein the substrate is made of metal.

8. The light module as claimed in claim 7, wherein the substrate is made of aluminum.

9. The light module as claimed in claim 7, wherein the first slot is formed on the first surface by punching.

10. The light module as claimed in claim 7, wherein the second slot is formed on the second surface by punching.

* * * * *